United States Patent [19]

Bouwknegt et al.

[11] 4,452,557
[45] Jun. 5, 1984

[54] DEVICE FOR THE SIMULTANEOUS POSITIONING OF A PLURALITY OF ELECTRICAL AND/OR ELECTRONIC PARTS ON A PRINTED CIRCUIT BOARD

[75] Inventors: Jan Bouwknegt; Louis F. A. Dieleman; Antonius C. Marneffe, all of Eindhoven, Netherlands

[73] Assignee: U.S. Philips Corporation, New York, N.Y.

[21] Appl. No.: 310,664

[22] Filed: Oct. 13, 1981

[30] Foreign Application Priority Data

Nov. 13, 1980 [NL] Netherlands ............... 8006194

[51] Int. Cl.$^3$ ............................................. B65G 59/04
[52] U.S. Cl. ..................................... 414/118; 29/740; 271/9; 271/30 R; 271/108; 294/64 R
[58] Field of Search ............... 414/117, 118, 120, 121, 414/627, 737, 744 A, 752; 271/9, 30 R, 108; 294/64 R, 65; 221/93, 94, 211; 29/740, 741, 759

[56] References Cited

U.S. PATENT DOCUMENTS

| | | | |
|---|---|---|---|
| 3,523,707 | 8/1970 | Roth | 294/65 |
| 3,888,725 | 6/1975 | French | 221/211 X |
| 4,375,126 | 3/1983 | Düll et al. | 29/740 |

FOREIGN PATENT DOCUMENTS 753771  8/1980  U.S.S.R. ................ 294/64 R

*Primary Examiner*—Leslie J. Paperner
*Attorney, Agent, or Firm*—Thomas A. Briody; Jack E. Haken; James J. Cannon, Jr.

[57] ABSTRACT

A device for the simultaneous positioning of a plurality of electrical and/or electronic parts on a printed circuit board, comprising a transport holder with a number of vacuum openings and a grid which is arranged therebelow and which comprises a matrix of openings in which there are accommodated a number of magazines containing stacks of said parts, the device comprising means for advancing the stacks of parts until the uppermost part of each stack is in a position in which it can be lifted by vacuum in order to be transported to the printed circuit board. The transport holder is constructed as a flat box which can be connected to a vacuum pump and which has substantially the same circumferential dimensions as the grid. The upper side and the lower side of said box are provided with a hole pattern which corresponds to the matrix of openings in the grid. In each pair of associated holes a hollow vacuum pin is arranged in a sealing and slidable manner. The upper end of each vacuum pin is sealed. In the sidewall of each vacuum pin there is provided an opening, each pin being slidable in both its guides to an active and an inactive position in which said opening is situated inside and outside the vacuum box, respectively.

4 Claims, 3 Drawing Figures

DEVICE FOR THE SIMULTANEOUS POSITIONING OF A PLURALITY OF ELECTRICAL AND/OR ELECTRONIC PARTS ON A PRINTED CIRCUIT BOARD

The invention relates to a device for the simultaneous positioning of a plurality of electrical and/or electronic parts on a printed circuit board, comprising a transport holder with a number of vacuum openings and a grid which is arranged therebelow and which comprises a matrix of openings in which there are accommodated a number of magazines, each of which contains a stack of said parts, the device comprising means for advancing the stacks of parts until the uppermost part of each stack is in a position in which it can be lifted by vacuum pin in order to be transported to the printed circuit board.

Devices of the kind set forth are known per se and are used for quickly and accurately transferring electrical and/or electronic parts of very small dimensions from their packing to a printed circuit board. The parts are packed in elongate tubular magazines which are arranged in the correct positions in openings of a grid which comprises a matrix of such openings. Underneath the grid there are provided means, for example, in the form of pins, which can be raised in order to shift the stacks of parts in the magazines upwards so that the uppermost parts arrive in a position in which they can be lifted by suitable means in order to be transported further. In a known device, these means are formed by a vacuum space with openings which correspond to the magazines in the grid.

It is a drawback of this device that for each pattern of parts on the printed circuit board another vacuum space with an adapted pattern of openings is required. This makes the device complex and the changing over to another positioning pattern is very time consuming.

The invention has for its object to provide a device which has a simple construction and which can be used for all positioning patterns, whilst the changing over to another pattern does not require a substantial amount of time.

The device in accordance with the invention is characterized in that the transport holder is constructed as a flat box which can be connected to a vacuum pump and which has substantially the same circumferential dimensions as the grid, the upper and lower side of said box being provided with a pattern of holes which corresponds to the matrix of openings in the grid, in each pair of associated holes there being arranged a hollow vacuum pin which is slidable in a sealing manner, the upper end of each vacuum pin being sealed and its sidewall comprising an opening, each pin being slidable in both its guides to an active position and an inactive position, said opening then being situated inside and outside the vacuum box, respectively.

In a further embodiment, each of the pins is sealed in each of its guide holes by means of an O-ring.

In a further preferred embodiment, the upper side and the lower side of the vacuum box are provided with a layer of silicon rubber, each of said layers comprising holes which correspond to the holes in the box and have a slightly smaller diameter.

Thus, a transport holder is obtained with a matrix of pins which corresponds to the matrix of the grid. The magazines can now be fitted in the desirable locations in the grid. Subsequently, the pins which correspond to the magazines are placed in their active position, i.e. they are pressed downwards so far that the opening in their sidewall is situated within the box, which means that the pins are evacuated so that parts can be lifted thereby. The other pins, corresponding to the openings of the grid in which no magazine is arranged, are placed in their inactive position, i.e. they are raised so far that the opening in their side wall is situated outside the vacuum box. The O-rings or silicon rubber draws air only via the active pins. The pins can thus be very quickly adjusted.

In a further embodiment of the device in accordance with the invention, a further grid with a matrix of openings corresponding to the matrix of the grid is arranged between the vacuum box and the grid, exchangeable product holders being accommodated in one or more openings of the further grid, each of said product holders comprising a passage opening for the relative vacuum pin and a lift opening which is adapted to the dimensions of the parts to be lifted.

The product holders are disposed at the areas where a magazine is situated and serve to separate the uppermost parts from the stacks and also to align the parts. The product holders may have a different construction which depends mainly on the method of alignment.

A feasible embodiment of a product holder is described in Netherlands Patent Application No. 80 04 834 and a further feasible embodiment is shown in U.S. application Ser. No. 320,814 of the same date. Depending on the type of product holder, the further grid has the possibility of movement parallel to the grid for separation and alignment and from and towards the grid for further transport or a different method of alignment.

It will be clear from the foregoing that the invention provides a universal device for the positioning of parts on a printed circuit board which can be very quickly adjusted for a given positioning pattern of the parts.

The invention will be described in detail hereinafter with reference to the drawing.

Figure 1:
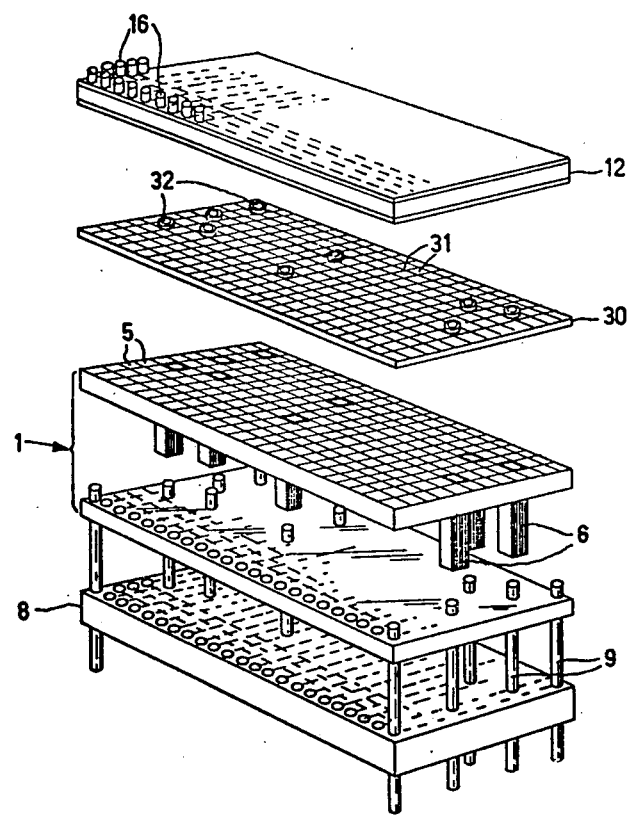
FIG. 1 is a diagrammatic perspective view of a device for the simultaneous positioning of a plurality of parts on a board.
Figure 2:
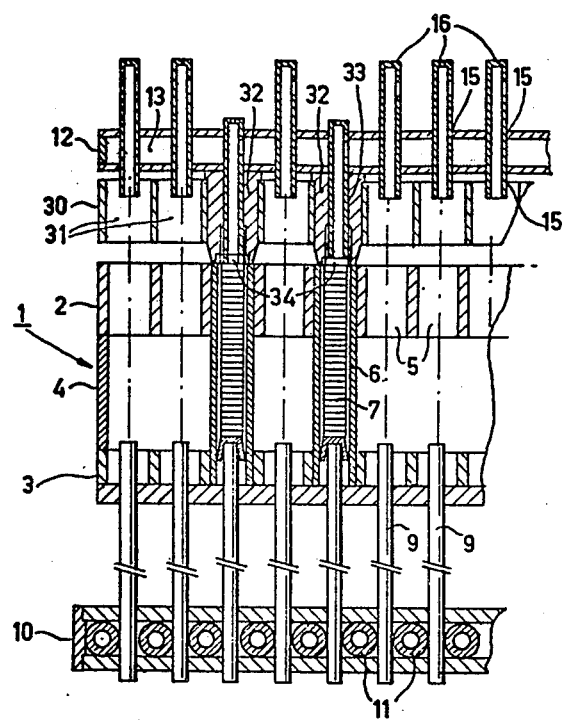
FIG. 2 is a diagrammatic sectional view at an increased scale of a part of the device shown in FIG. 1.

The reference numeral 1 in FIG. 1 denotes a grid which is composed of an upper grid 2, a lower grid 3 and a connection portion 4 as shown in FIG. 2. The grid comprises a matrix of openings 5. In some of these openings there is arranged a magazine containing a stack of electrical and/or electronic parts 7. Underneath the grid 1 there is arranged a pin holder 8 with a number of pins 9 which are slidable therein with friction. The number of pins 9 is equal to and is arranged in the same way as the openings 5 in the grid 1.

The construction of the pin holder 8 is shown at an increased scale in FIG. 2 which shows that the pin holder is formed by a flat box 10; between the rows of pins 9 there is arranged a tube 11 in which a medium can be introduced at such a pressure that a given, desirable friction is obtained between the tube 11 and each of the pins 9. It has been found that thanks to this construction the friction between each of the pins and the tube is substantially the same; this aspect is of vital importance for suitable operation of the device.

The pin holder 8 can be moved upwards (by means not shown in the drawing), the pins 9 which cooperate with the lower side of a stack of parts 7 then raising the stack. This is step-wise effected, each time the uppermost part of a stack being arranged in a position such that its lower side is just above the upper edge of the relevant magazine.

Above the grid 1 there is arranged a transport holder 12 in the form of a flat box, whose interior can be connected to a vacuum pump (not shown). The upper side and the lower side of the box 12 comprise a number of openings 15, the situation of which corresponds to that of the openings 15 in the grid 1. In each pair of openings 15 a vacuum pin 16 is arranged to be slidable with friction.

Figure 3:
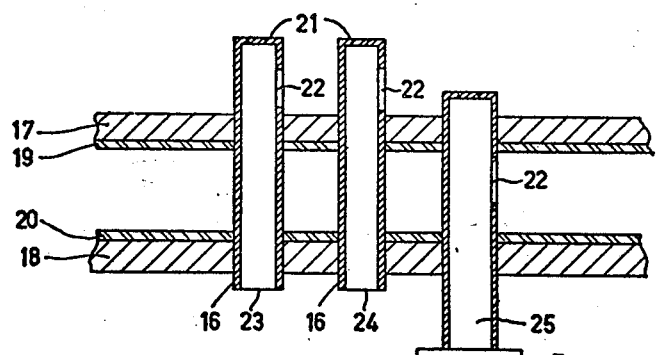
FIG. 3 is a diagrammatic sectional view of a part of the vacuum box with pins.

FIG. 3 shows, at an increased scale, a part of the vacuum box 12 with a pair of pins 16. It appears that the upper side 17 as well as the lower side 18 of the box 12 comprises a layer of silicon rubber 19, 20, respectively.

The pins 16 are hollow and their upper end 21 is sealed. The sidewall of the pins is provided with an opening 22.

The diameter of the holes in the layers of silicon rubber is slightly smaller than that of the corresponding holes in the upper and the lower side of the box. It is thus achieved that the silicon rubber seals the pins and also that sufficient friction is imparted to keep the pins in position.

The pins 16 can be moved as desired to an upper, inactive position (see pins 23 and 24) or to a lower, active position (see pin 25).

In the inactive position, the opening 22 is situated outside the box 12, so that these pins are isolated from the vacuum pump. In the active position, the opening 22 is situated within the box 12 and the pin 25 is evacuated, so that a part 7 can be lifted from a magazine.

Instead of realizing the sealing and friction of the pins by means of said layers of silicon rubber, it is alternatively possible to seal each of the pins separately in the relevant hole by means of an O-ring.

Between the transport holder 12 and the grid 1 there is arranged a further grid 30 with a matrix of opening 31 in which product holders 32 can be arranged. These product holders 32 comprise a central passage 33 wherethrough the relevant vacuum pin 16 can project. Each product holder 32 furthermore comprises a cavity 34 for accommodating a part, the shape and dimensions of said cavity being adapted to the relevant part. The product holders serve on the one hand to protect the part during the transport to the circuit board and on the other hand to align the relevant part with respect to a reference axis or face.

For the alignment, the product holders may be constructed as a kind of collet with resilient jaws which are moved towards one another during alignment until the part contacts all jaws. It is alternatively possible for the product holders to have a rigid construction, the transport holder and the further grid then being moved in two mutually perpendicular directions with respect to the grid 2 during the separation of the parts from the stacks. The parts lifted by the relevant vacuum pins then experience friction and are aligned with respect to two references faces the cavity 34.

Thus, a device is obtained which can be very simply adjusted for the positioning of different parts on a printed circuit board according to a given pattern.

To this end, first the magazines 6 containing stacks 7 of the relevant parts are arranged in the appropriate positions in the grid 1.

Subsequently, in the positions of the further grid 30 which correspond to the magazines there are arranged product holders 32 with product cavities 34 which correspond to the relevant parts.

Subsequently, the vacuum pins 16 are brought into their active position above the product holders, whilst the other pins are placed in their inactive position.

The machine is then ready and the pin holder 10 can be moved upwards one step until all uppermost parts are situated outside the relevant magazine and press against the active pins 16 of the vacuum pin holder 12. Subsequently, the vacuum pin holder 12 and the further grid 30 connected thereto is moved parallel to the grid 2 over a given distance in order to ensure that the relevant parts are indeed separated from the relevant stack. During this operation, the parts can already be aligned in the relevant cavity 34. Subsequently, the vacuum pin holder and the further grid connected thereto are moved away from the grid 2 and positioned opposite the printed circuit board on which the parts are to be positioned.

What is claimed is:

1. A device for the simultaneous positioning of a plurality of electrical and/or electronic parts on a printed circuit board, comprising a transport holder with a number of vacuum openings and a grid which is arranged therebelow and which comprises a matrix of openings in which there are accommodated a number of magazines which contain stacks of said parts, the device comprising means for advancing the stacks of parts until the uppermost part of each stack is in a position in which it can be lifted by vacuum in order to be transplanted to the printed circuit board, characterized in that the transport holder is constructed as a flat box which can be connected to a vacuum pump and which has substantially the same circumferential dimensions as the grid, the upper and lower side of said box being provided with a pattern of guide holes which corresponds to the matrix of openings in the grid, in each pair of associated holes there being arranged a hollow vacuum pin which is slidable in a sealing manner, the upper end of each vacuum pin being sealed and its sidewall comprising an opening, each pin being slidable in both its guide holes to an active position and an inactive position, said opening then being situated inside and outside the vacuum box, respectively.

2. A device as claimed in claim 1, characterized in that each of the pins is sealed in each of its guide holes by means of an O-ring.

3. A device as claimed in claim 1, characterized in that the upper side and the lower side of the vacuum box are provided with a layer of silicon rubber, each of said layers comprising holes which correspond to the holes in the sides of the box but which have a diameter which is slightly smaller.

4. A device as claimed in claim 1, 2 or 3, characterized in that between the vacuum box and the grid there is provided a further grid with a matrix of openings which corresponds to the matrix of the grid, exchangeable product holders being accommodated in one or more openings of the further grid, each of said product holders comprising a passage opening for the relevant vacuum pin and a lift opening which is adapted to the dimensions os the part to be lifted.

* * * * *